United States Patent
Low et al.

(10) Patent No.: US 7,402,820 B2
(45) Date of Patent: Jul. 22, 2008

(54) ION BEAM CONTAMINATION DETERMINATION

(75) Inventors: Russell Low, Rowley, MA (US); Joseph C. Olson, Beverly, MA (US); Antonella Cucchetti, Beverly, MA (US); Anthony Renau, W. Newbury, MA (US); Marie Welsch, Georgetown, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 497 days.

(21) Appl. No.: 11/289,885

(22) Filed: Nov. 30, 2005

(65) Prior Publication Data

US 2007/0241276 A1 Oct. 18, 2007

(51) Int. Cl.
*H01L 21/425* (2006.01)
*H01J 37/317* (2006.01)

(52) U.S. Cl. .............................. 250/492.21
(58) Field of Classification Search ........... 250/492.21
See application file for complete search history.

(56) References Cited

U.S. PATENT DOCUMENTS

| | | | |
|---|---|---|---|
| 6,313,475 B1 * | 11/2001 | Renau et al. | 250/492.21 |
| 6,541,780 B1 * | 4/2003 | Richards et al. | 250/492.2 |
| 6,670,624 B1 * | 12/2003 | Adams et al. | 250/492.21 |
| 7,227,160 B1 * | 6/2007 | Vanderberg et al. | 250/492.21 |
| 2007/0269966 A1 * | 11/2007 | Suvorov | 438/514 |

* cited by examiner

*Primary Examiner*—Jack I Berman

(57) ABSTRACT

A system, method and program product for determining contamination of an ion beam are disclosed. In the event of an isobaric interference, or near isobaric interference between a contaminant ion and an expected ion of an ion beam, which is difficult to detect, it is possible to measure a third ion in the ion beam and estimate, based on the amount of the third ion measured, a relative amount of the contaminant ion compared to the expected ion. The estimated relative amount of the contaminant ion is used together with a measured mass resolution of the ion implantation system to determine whether an ion implantation process needs to be suspended.

35 Claims, 6 Drawing Sheets

ION BEAM CONTAMINATION DETERMINATION

BACKGROUND OF THE INVENTION

1. Technical Field

The present invention relates generally to ion implantation, and more particularly, to a system, method and program product for determining an ion beam contamination.

2. Related Art

Ion implantation is a standard technique for introducing conductivity altering impurities into, or doping, semiconductor wafers. A typical ion implantation process uses an energetic ion beam to introduce impurities (ions) into semiconductor wafers. During ion implantation, when a source feed material is energized to form an ion beam, species of different chemical elements may be energized to generate ions having the same or very similar mass/charge ratio as the expected ion, which may be difficult to separate from the expected ions in the ion beam in a commercially productive manner. As a consequence, the contaminant ions will also be implanted into the semiconductor wafers, which may cause serious divergences in the desired parameters of semiconductor devices made from the wafers, and lead to scrap.

To avoid an implantation of a contaminated ion beam, measurements need to be taken to determine the existence and/or seriousness (i.e., the relative amount of a contaminant ion) of an ion beam contamination. However, if the mass/charge ratio of a contaminant ion is very close to that of an expected ion, it is difficult to detect the existence of the contaminant ion directly because a peak of the contaminant ion and a peak of the expected ion may be difficult to separate in a mass spectrum graph. As such, there is a need to determine the existence and/or seriousness of an ion beam contamination indirectly. There is also a need to determine whether an ion implantation system has a capacity to filter out contaminant ions sufficiently to make a potential contamination meet a preset threshold.

SUMMARY OF THE INVENTION

A system, method and program product for determining contamination of an ion beam are disclosed. In the event of an isobaric interference, or near isobaric interference between a contaminant ion and an expected ion of an ion beam, which is difficult to detect, it is possible to measure a third ion in the ion beam and estimate, based on the amount of the third ion measured, a relative amount of the contaminant ion compared to the expected ion. The estimated relative amount of the contaminant ion is used together with a measured mass resolution of the ion implantation system to determine whether an ion implantation process needs to be suspended.

A first aspect of the invention is directed to a method for determining a contamination of an ion beam generated in an ion implantation system, the method comprising steps of: estimating a first amount of a contaminant first ion in the ion beam before the ion beam is filtered by measuring an amount of a second different ion in the ion beam before the ion beam is filtered; and determining the contamination of the ion beam based on the estimated first amount of the contaminant first ion.

A second aspect of the invention is directed to a program product stored on a computer-readable medium, which when executed, enables a computer infrastructure to determine a contamination of an ion beam generated in an ion implantation system, the program product comprising computer program code for enabling the computer infrastructure to: estimate a first amount of a contaminant first ion in the ion beam before the ion beam is filtered by measuring an amount of a second different ion in the ion beam before the ion beam is filtered; determine the contamination of the ion beam based on the estimated first amount of the contaminant first ion; and communicate a result of the determination to a user of the ion implantation system.

A third aspect of the invention is directed to an ion implantation system, the ion implantation system comprising: an ion beam generating system for generating an ion beam; and a contamination determining system including: a measurer for measuring an amount of an experiment ion in the ion beam before the ion beam is filtered; and an estimator for estimating a first amount of a contaminant ion different than the experiment ion based on the measurement of the experiment ion in the ion beam before the ion beam is filtered to determine the contamination of the ion beam.

A fourth aspect of the invention is directed to a system for determining a contamination of an ion beam generated in an ion implantation system, the system comprising: a measurer for measuring an amount of an experiment ion in the ion beam before the ion beam is filtered; and an estimator for estimating a first amount of a contaminant ion different than the experiment ion based on the measurement of the experiment ion in the ion beam before the ion beam is filtered to determine the contamination of the ion beam.

A fifth aspect of the invention is directed to a method of generating a system for determining a contamination of an ion beam generated in an ion implantation system, the method comprising: providing a computer infrastructure operable to: estimate a first amount of a contaminant first ion in the ion beam before the ion beam is filtered by measuring an amount of a second different ion in the ion beam before the ion beam is filtered; determine the contamination of the ion beam based on the estimated first amount of the contaminant first ion; and communicate a result of the determination to a user of the ion implantation system.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

1. Ion Implantation System Overview

Figure 1:
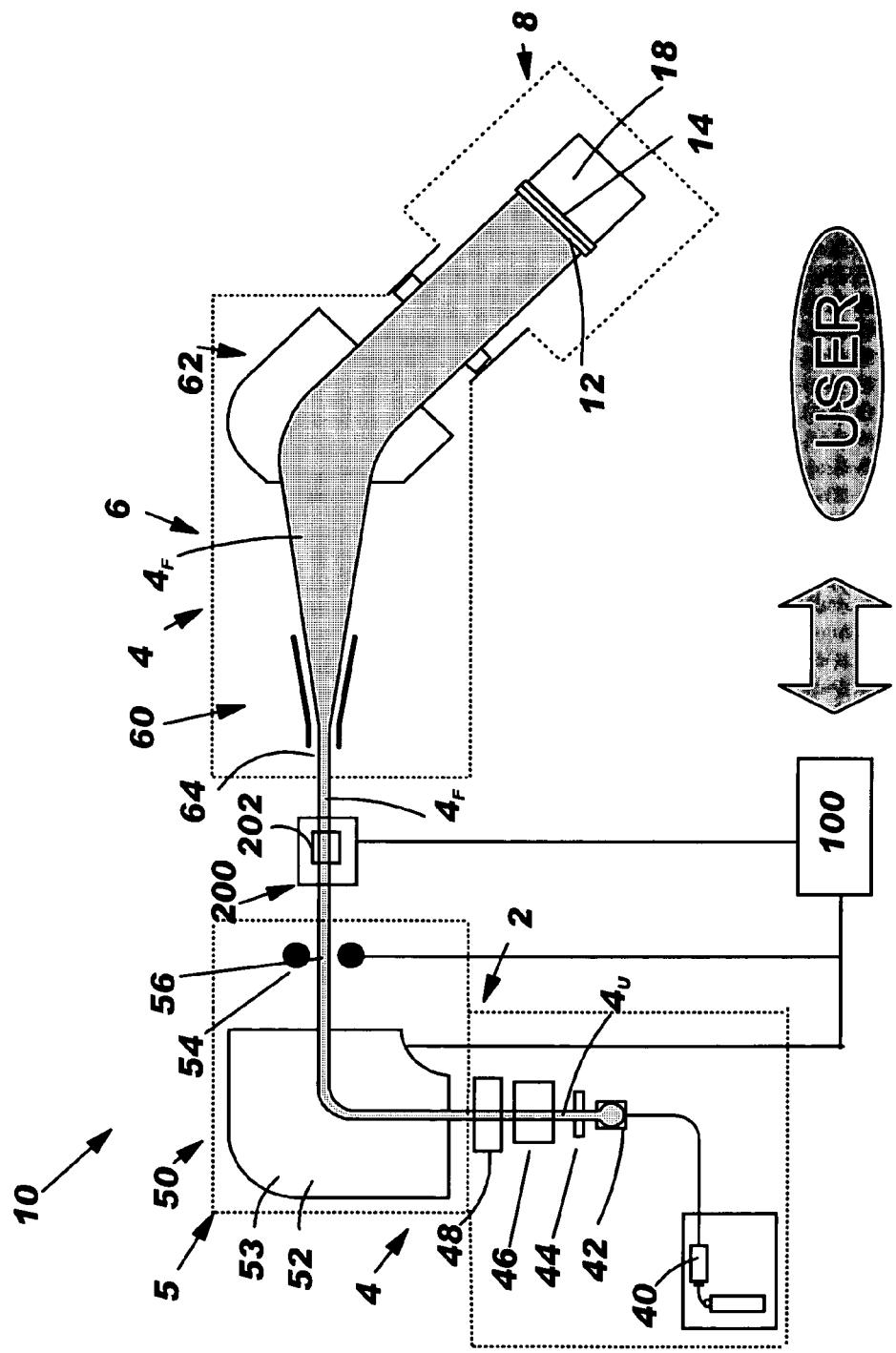
FIG. 1 shows a schematic view of an ion beam implantation system according to one embodiment of the invention.

With reference to the accompanying drawings, FIG. 1 shows an illustrative ion implantation system 10, which may be used in the present invention. Ion implantation system 10 includes an ion beam generating sub-system 2 for generating and transmitting an ion beam 4, through ion beam filtering sub-system 5, ion beam scanning sub-system 6, to a target sub-system 8. Ion beam generating sub-system 2 may include any now known or later developed ion beam generator such as those available from Varian Semiconductor Equipment Associates. Typically, target sub-system 8 includes one or more semiconductor targets 12 (e.g., wafer) mounted to a platen 14. Characteristics of platen 14 and, hence, target 12, may be controlled by a platen drive assembly (not shown) that rotates target 12, i.e., wafer, and by a target vertical scan position controller 18 that controls the vertical position of target 12. Ion implantation system 10 may include additional components known to those skilled in the art. For example, target sub-system 8 typically includes an automated wafer handling equipment for introducing wafers into ion implantation system 10 and for removing wafers after implantation, a dose measurement device, an electron flood gun, etc. It will be understood that the entire path traversed by ion beam 4 is evacuated during an ion implantation.

Besides the above-described components, ion beam generating sub-system 2 may include a gas flow 40, an ion beam source 42, an extraction manipulator 44, a filter magnet 46, and an acceleration/deceleration column 48. Filter magnet 46 is preferably positioned in close proximity to ion beam source 42. Extraction manipulator 44 is positioned between filter magnet 46 and ion beam source 42. Acceleration/deceleration column 48 is positioned between source filter 46 and mass analyzer 50.

Ion beam filtering sub-system 5 may include a mass analyzer 50 including, for example, a dipole analyzing magnet 52 with a semicircle radius 53, a mass resolving slit 54 having a resolving aperture 56. As is well known in the art, ion beam 4 may include different combinations of ions in different stages of the path it traverses. For example, before mass analyzer 50, where ion beam 4 is filtered, ion beam 4 contains more contaminant ions than after mass analyzer 50. Here, for descriptive purpose only, ion beam 4 before mass analyzer 50 is referred as unfiltered ion beam $4_U$ and ion beam 4 after mass analyzer 50 is referred as filtered ion beam $4_F$.

Scanning sub-system 6 may include, for example, a scanner 60 and an angle corrector 62. Scanner 60, which may be an electrostatic scanner, deflects filtered ion beam $4_F$ to produce a scanned ion beam $4_F$ having ion trajectories which diverge from a scan origin 64.

Ion implantation system 10 may be attached to a computer system 100 and a measurer 200. Measurer 200 may be positioned close to and after mass analyzer 50. Measurer 200 is coupled to computer system 100 to receive measurement parameters from and communicate measurement results to computer system 100. Measurer 200 may be any devices that can measure ion beam 4 current. According to one embodiment, measurer 200 includes a faraday cup 202. Because unfiltered ion beam $4_U$ is often measured after system setup through the filtering of mass analyzer 50, faraday cup 202, which is positioned close to mass analyzer 50, is usually referred as a setup cup 202.

Additional features of computer system 100 will be further described in details below. As shown in FIG. 1, computer system 100 is communicating with a user of ion implantation system 10.

Although an illustrative ion implantation system 10 has been illustrated above, it should be understood by those skilled in the art that any now known or later developed system to generate and scan ion beam 4 may be used for the current invention. It is well known in the art how an ion beam 4 is generated by generating sub-system 2 and scanned by scanning sub-system 6. Therefore, description of those processes is not necessary for the understanding of the current invention. However, it should be understood that the current invention can be used with any now known or later developed process and methods of ion implantation.

2. Computer System

Figure 2:
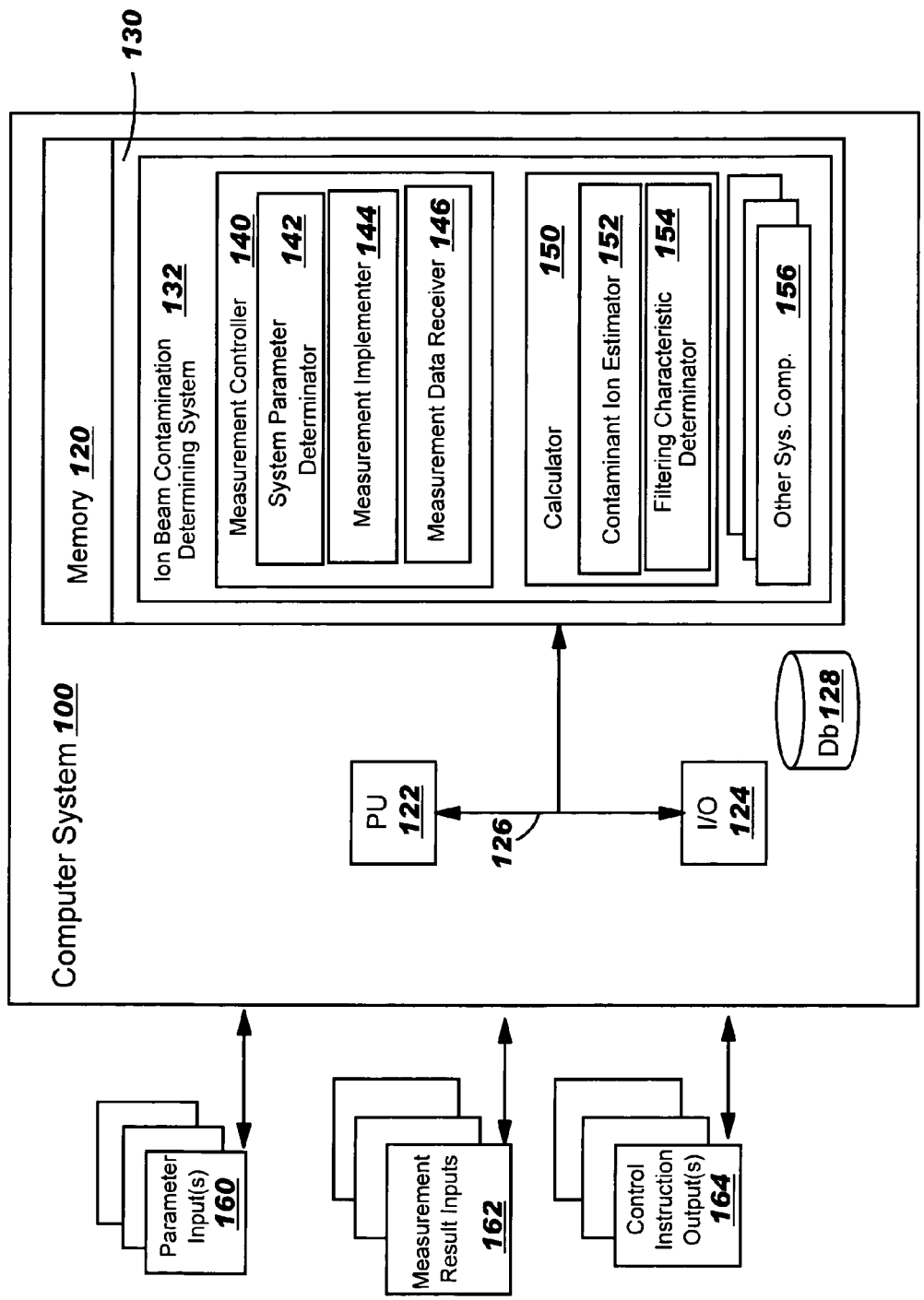
FIG. 2 shows a block diagram of an illustrative computer system according to one embodiment of the invention.

Referring to FIG. 2, a block diagram of an illustrative computer system 100 is shown. Computer system 100 may be a computer control system responsive to, inter alia, measurer 200 and mass analyzer 50 including analyzing magnet 52 and mass resolving slit 54 (FIG. 1). In one embodiment, computer system 100 includes a memory 120, a processing unit (PU) 122, input/output devices (I/O) 124 and a bus 126. A database 128 may also be provided for storage of data relative to processing tasks. Memory 120 includes a program product 130 that, when executed by PU 122, comprises various functional capabilities described in further detail below. Memory 120 (and database 128) may comprise any known type of data storage system and/or transmission media, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations. I/O 124 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 100.

As shown in FIG. 2, program product 130 may include an ion beam contamination determining system 132 that includes a measurement controller 140 including a system parameter determinator 142, a measurement implementer 144 and a measurement data receiver 146; a calculator 150 including a contaminant ion estimator 152 and filtering characteristic determinator 154; and other system components 156. Other system components 156 may include any now known or later developed parts of a computer system 100 not individually delineated herein, but understood by those skilled in the art.

Referring to FIGS. 1 and 2, inputs to computer system 100 includes parameter inputs 160 and measurement result inputs 162. Parameter inputs 160 include, for example, those from measurer 200 and ion implantation system 10 including mass analyzer 50. Parameter inputs 160 may indicate, among other things, particular states of measurer 200 and mass analyzer 50, and/or particular components thereof or may indicate user defined input parameters. That is, a parameter input 160 may be any characteristic of measurer 200 and/or mass analyzer 50, user defined constants or other variables that may affect measurement results of measurer 200. Based on the above-described components of ion implantation system 10, parameter inputs 160 may include, for example, analyzing magnet current (not shown) and mass resolving slit 54 settings.

Measurement result inputs 162 include the measurement results of measurer 200, including specifically, a beam current of the ion beam that reaches setup cup 202. Control instructions 164 include the instructions to set up measurer 200 and ion implantation system 10 parameters similar to those received at parameter inputs 160. It should be recognized that the above-described list is meant to be illustrative only. For example, it is common for a computer system 100 to receive more than 5000 parameter inputs depending on the makeup of the ion implantation system 10 used.

3. Ion Beam Contamination Determining System

Ion beam contamination determining system 132 functions generally to determine the existence and/or seriousness of a contamination in ion beam 4 (FIG. 1). One embodiment of the operation of ion beam contamination determining system 132 is shown in the flow diagram of FIG. 3. For illustration purpose only, in the following description of the embodiment(s), an illustrative ion beam 4 includes 115In++ (an isotope of indium) as the expected ion and 57Fe+ (an isotope of iron) and 58Ni+ (an isotope of nickel) as the potential contaminant ions. A VIISta 810 (available from Varian Semiconductor Equipment Associate, Inc) is used as an illustrative ion implantation system 10. VIISta 810 needs to run 115In++ for energies above 130 kV. The mass/charge ratio of 115In++ is 115/2=57.5, which is very close to the mass/charge ratio of 57Fe+ and 58Ni+ (57 and 58, respectively). As such, if ion beam source 42 of ion beam generating sub-system 2 includes Fe and Ni atoms, 57Fe+ and 58Ni+ ions will be energized into ion beam 4 and may be implanted into target 12 (e.g., a wafer) as contaminant ions because they may not be separated from an ion beam of 115In++ in a commercially productive manner under normal operating conditions due to the proximity in mass/charge ratio. The following descriptions show how ion beam contamination determining system 132 functions to determine the existence and amount of 57Fe+ and 58Ni+ in unfiltered ion beam $4_U$ of 115In++ and in target 12, according to one illustrative embodiment. This illustrative embodiment of operation will be described with reference to FIGS. 1 and 2. It should be noted that the above-identified example is presented for illustrative purposes only and the scope of the present invention is not limited to a determination of 57Fe+ and 58Ni+ in an ion beam of 115In++.

Figure 3:
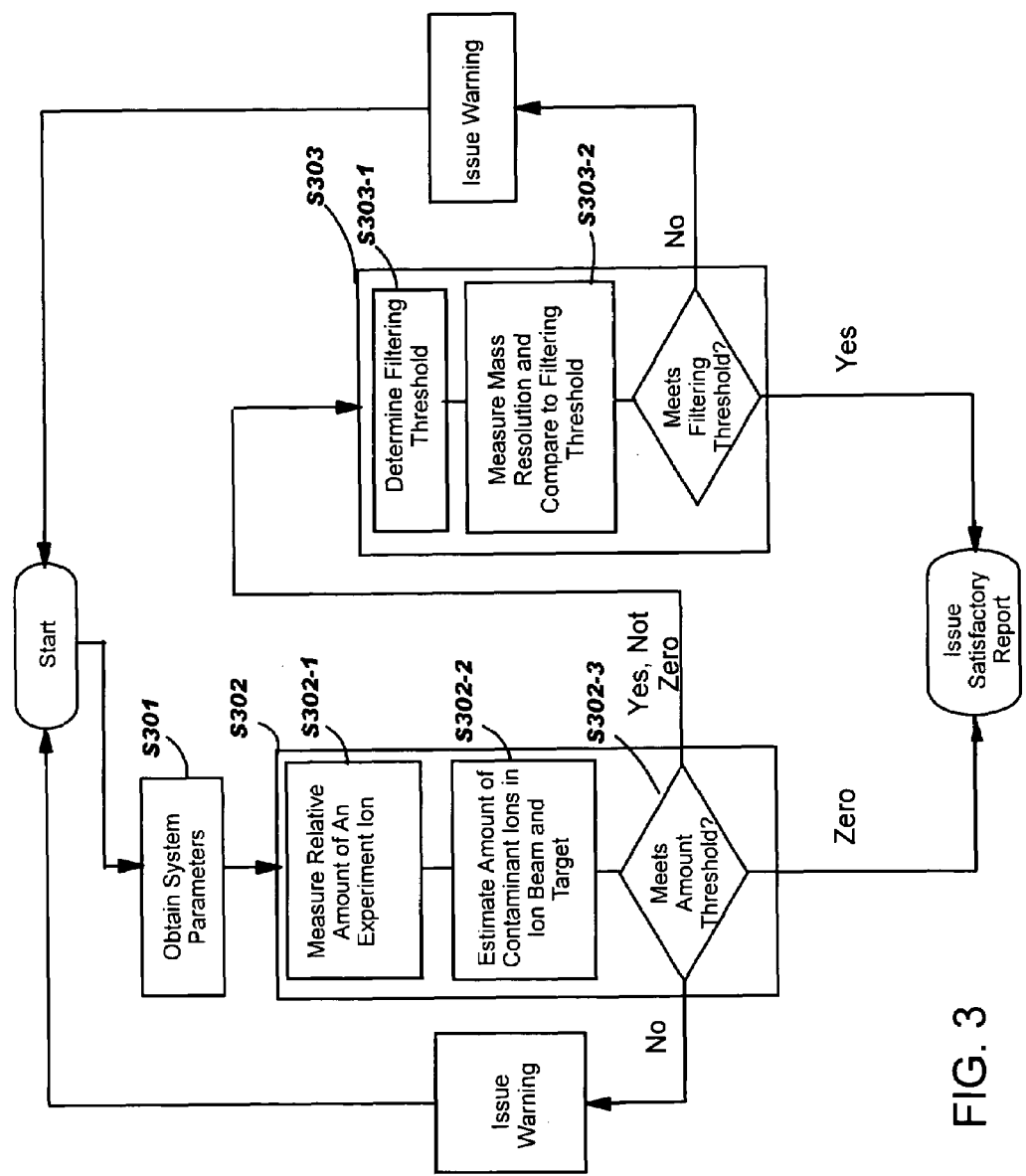
FIG. 3 shows a flow diagram of one embodiment of the operation of an ion beam contamination determining system according to the invention.

Referring to FIG. 3, first, in step S301, system parameter determinator 142 of measurement controller 140 obtains the pre-determined/known system parameters including, but not limited to, mass resolving slit (MRS) 54 setting and analyzing magnet 52 current that corresponds to a mass/charge (m/q) ratio of ions that are allowed to pass through mass analyzer 50. Mass resolving slit (MRS) 54 setting corresponds to a minimum mass resolution according to the specification of ion implantation system 10. Table 1 shows the correlation between MRS settings and the minimum mass resolutions. As shown in Table 1, as MRS becomes smaller, e.g., from 2.5 to 1.5, the expected minimum mass resolution increases, which means ions of different mass/charge ratio are more efficiently filtered out. For example, more 57Fe+ and 58Ni+ will be filtered out.

TABLE 1

Correlations Between MRS setting and Minimum Mass Resolution

| MRS Setting (mm) | Minimum Mass Resolution |
|---|---|
| 1.5 | 130 |
| 2.5 | 105 |
| 3.5 | 85 |

Theoretically, a mass resolution greater than 200 would be sufficient to remove all 57Fe+ and 58Ni+ from ion beam 4 of 115In++. However, a mass resolution of 200 is impossible to achieve in normal operation with typical ion implantation systems, and is also undesirable from a productivity perspective because such a high mass resolution reduces the usable beam current substantially. A preferable situation would be to know an amount of the contaminant ions (if any) that are present in the expected ion beam and to determine a minimum mass resolution required to filter out just enough contaminant ions to ensure that the amount of the contaminant ions in target 12 (FIG. 1) meets a preset threshold.

Next, in step S302, measurement implementer 144 and contaminant ion estimator 152 function together to estimate an amount of a contaminant ion (here, 57Fe+ isotope and 58Ni+ isotope) in unfiltered ion beam $4_U$ and in target 12 (FIG. 1). Here, as described before, because 57Fe+ and 58Ni+ are very close to 115In++ in mass/charge ratio, and it is difficult to separate a peak of 57Fe+ (or 58Ni+) from a peak of 115In++ in a mass spectrum graph. That is, it is difficult to determine the relative amounts (proportions) of the contaminant ions, here 57Fe+ and 58Ni+, compared to the expected ion, here 115In++, because the relative amounts of ions are determined by comparing the maximum currents of ion beam profile peaks. To avoid this problem, the present invention estimates the relative amount of a contaminant ion, for example, 57Fe+, by measuring a relative amount of a different isotope of the same element as the contaminant ion (here, 56Fe+) that can be separated from the expected ion, here 115In++. The different isotope is referred as an experiment isotope for descriptive purpose. The desirability of this measurement is based on a finding that when atoms of an element (e.g., Fe) are energized, different isotopes of the element will have relatively fixed natural abundances (%) among all the isotopes. For example, iron (Fe) has four isotopes with the following natural abundances as shown in Table 2.

TABLE 2

Natural Abundance of Iron Isotopes

| Isotope | Abundance (%) |
|---|---|
| 54Fe+ | 5.8 |
| 56Fe+ | 91.6 |
| 57Fe+ | 2.2 |
| 58Fe+ | 0.33 |

Of the four isotopes of iron, 57Fe+ and 58Fe+ are difficult to be separated from 115In++, while both 54Fe+ and 56Fe+ can be easily separated from 115In++. Therefore, if the relative amounts (proportions) of 54Fe+ or 56Fe+ in unfiltered ion beam $4_U$ (FIG. 1) are measured, the relative amount of 57Fe+ in the same ion beam $4_U$ can be estimated based on the natural abundance. For example, if 91.6 units of 56Fe+ are measured in ion beam $4_U$, it can be estimated that 2.2 units of 57Fe+ are also in ion beam $4_U$. In one embodiment, 56Fe+ is a better candidate than 54Fe+ to be used as an experiment isotope to estimate 57Fe+ because its larger abundance facilitates an accurate measurement.

Figure 4:
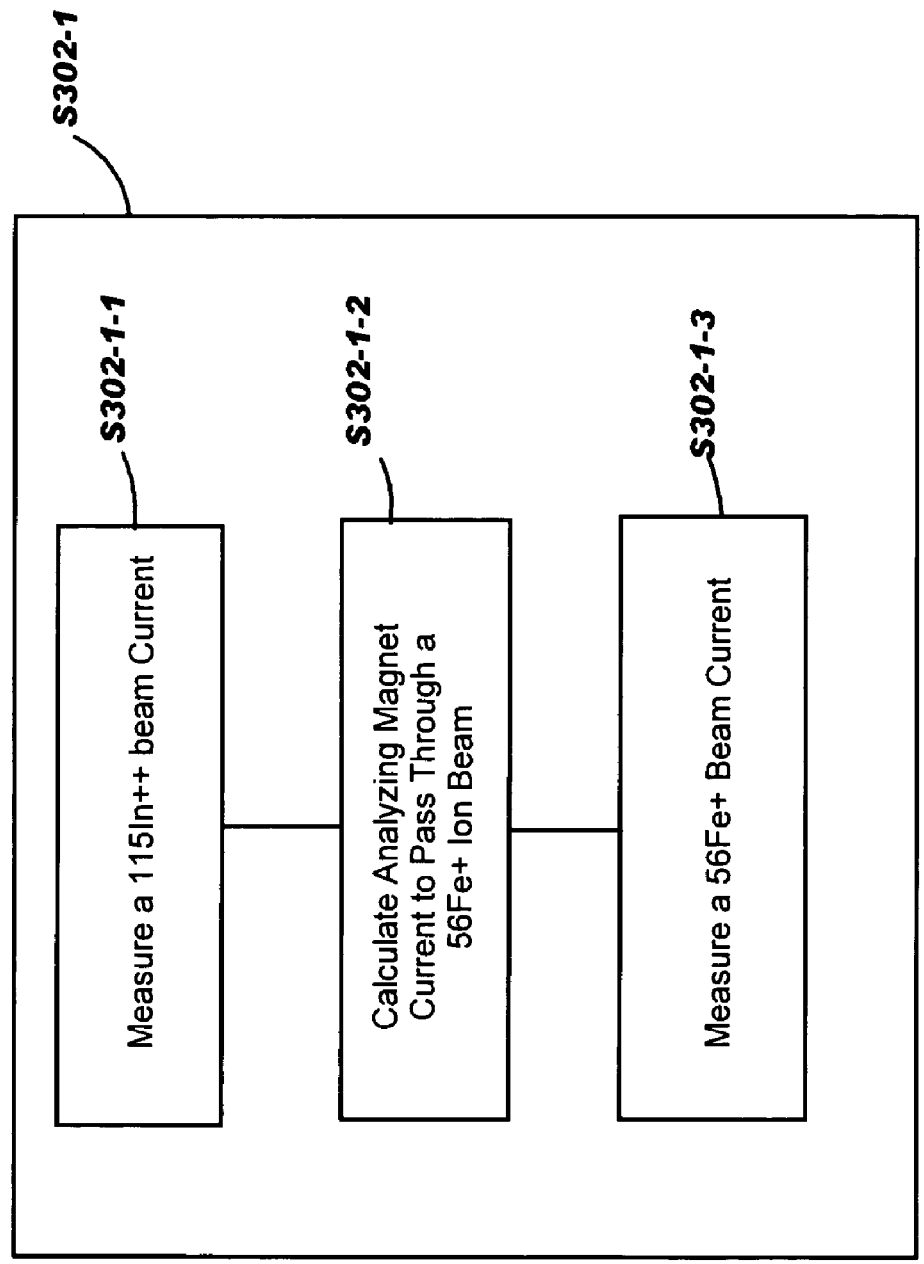
FIG. 4 shows details of step S302-1 of the flow diagram of FIG. 3 according to one embodiment of the invention.

Specifically, in step S302-1, measurement implementer 144 controls a measurement of a relative amount of the experiment isotope 56Fe+ compared to that of the expected ion 115In++. Step S302-1 includes sub-steps as shown in FIG. 4. Referring now to FIG. 4, in step S302-1-1, measurement implementer 144 determines and controls (sets) analyzing magnet 52 current to let an ion beam of 115In++ pass through and reach measurer 200 including, e.g., setup cup 202, to measure an ion beam current profile. The following formula may be used in the determination of analyzing magnet 52 current:

$$m/q = B^2 * r^2 / 2V \quad (1)$$

wherein m/q indicates mass/charge ratio; B indicates the magnetic field strength of analyzing magnet 52; r indicates semicircle radius 53; and V indicates the accelerating potential, here e.g., 70 kV. Based on formula (1), with given semicircle radius r and accelerating potential V, a value of magnetic field strength B can be obtained for a required mass/charge ratio m/q. An analyzing magnet 52 current can be obtained based on a determined magnetic field strength B, as is known in the art.

Measurement results of measurer 200 (FIG. 1) are obtained (received) by measurement data receiver 146 through measurement result inputs 162 and may be stored in database 128 (FIG. 2). Please note that because 115In++ is an expected ion, analyzing magnet 52 current may already be set to pass through an ion beam of 115In++ and the calculation of analyzing magnet 52 current may be skipped in step S302-1-1. According to this embodiment, all beam current measurements are converted into particle beam currents, not electrical beam current.

Next in step S302-1-2, measurement implementer 144 calculates the required analyzing magnet 52 current to let an ion beam of the experiment isotope, here 56Fe+, pass through, according to, for example, formula (1).

Next in step S302-1-3, measurement implementer 144 (FIG. 2) controls analyzing magnet 52 (FIG. 1) to change its current to the value calculated in step S302-1-2 to let an ion beam of 56Fe+ pass through and reach measurer 200 to measure a beam current profile. Similarly, the measurement results are obtained (received) by measurement data receiver 146 and may be stored in database 128 (FIG. 2). Please note, in step S302-1-1 to S302-1-3, measurement implementer 144 may also request system parameter determinator 142 (FIG. 2) to control (change) measurer 200 settings for a measurement of an ion beam of 56Fe+. For example, a current range of setup faraday cup 202 (FIG. 1) may be changed.

It should be understood that the measurement results of step S302-1 (FIG. 3) represent the proportions of 56Fe+ and 115In++ in unfiltered ion beam $4_U$, i.e., ion beam 4 that has not been filtered by mass analyzer 50.

Referring back to FIG. 3, next in step S302-2, contaminant ion estimator 152 estimates an amount of contaminant ions 57Fe+ and 58Ni+ in ion beam $4_U$ and in target 12, based on the measured amount of the experiment isotope, 56Fe, in ion beam $4_U$. Specifically, estimator 152 first calculates a ratio between 56Fe+ beam current and 115In++ beam current obtained in step S302-1, which represents a ratio ($R_1$) between the amounts of 56Fe+ particles and 115In++ particles in ion beam $4_U$. Next, based on $R_1$, estimator 152 estimates a ratio between 57Fe+ and 115In++ ($R_2$) in unfiltered ion beam $4_U$, according to the following formula:

$$R_2 = R_1 * 2.2/91.6 \quad (2)$$

The relative amount of 58Ni+ in ion beam $4_U$ can be estimated similarly by measuring a different isotope of Ni that can be separated from an ion beam of 115In++. For example, according to one embodiment, the amount of 58Ni+ can be estimated by measuring 60Ni+ in ion beam $4_U$.

According to an alternative embodiment, the amount of 58Ni+ can be estimated from the measured 56Fe+ to simplify the procedure. Based on a SIMS measurement of ion implantation system 10 with stainless steel 304 in ion beam source 42 (FIG. 1), 57Fe+ and 58Ni+ retain a one-to-one ratio in unfiltered ion beam $4_U$. If 57Fe+ is detected (estimated to be present) in unfiltered ion beam $4_U$, it is assumed that ion beam $4_U$ will also contain a similar amount of 58Ni+. As such, it may be estimated that a ratio between contaminants 57Fe+ and 58Ni+ and the expected 115In++ in ion beam $4_U$ is two times the ratio between 57Fe+ and 115In++, i.e., 2*$R_2$. To accommodate possible errors in the estimation, a safety factor of, for example, 2X may be applied to the estimated amounts (ratios) of 57Fe+ and 58Ni+ to obtain a final estimated relative amount of contaminant ions (57Fe+ and 58Ni+), which maybe used to estimate an amount of contaminant ions (57Fe+ and 58Ni+) in filtered ion beam 4F that will be implanted into target 12 (FIG. 1). As a consequence, an amount of contaminant ions in target 12 will be estimated. Specifically, estimator 152 calculates an amount of contaminant ions 57Fe+ and 58Ni+ in filter ion beam $4_F$ based on the estimated amount of 57Fe+ and 58Ni+ in ion beam $4_U$ (which are estimated based on the measured amount of 56Fe+ in ion beam $4_U$ according to one embodiment) and a measured or saved mass resolution value of mass analyzer 50. As is understood in the art, the amount of 57Fe+ and 58Ni+ in ion beam $4_F$ corresponds to the same amount in target 12. Please note, the specific formulae of the calculations are not necessary for an understanding of the present invention. As such, no further details will be provided.

Next in step S302-3, the estimated amount of contaminant ions 57Fe+ and 58Ni+ in target 12 is compared to a preset threshold. For example, for an implantation of 115In++, a threshold of contaminant ions (57Fe+ and 58Ni+) may be set to be less than 5 ppm (particles per million) in target 12 (FIG. 1). If the estimated amount of 57Fe+ and 58Ni+ in target 12 is larger than the threshold, a warning needs to be communicated to a user of ion implantation system 10 through, e.g., input/output devices (I/O) 124 (FIG. 2), to suspend implantation and maintain/repair ion beam generating sub-system 2 to avoid scrap. If there is no contaminant ion, i.e., zero 56Fe+ detected in ion beam $4_U$ in step 302-1, which corresponds to zero 57Fe+ and 58Ni+ in target 12, a satisfactory report will be communicated to a user of ion implantation system 10 through, e.g., input/output devices (I/O) 124, to continue ion implantation. If the estimated amount of contaminant ions 57Fe+ and 58Ni+ is less than the threshold, but larger than zero, further determination procedures need to be taken and the operation of ion beam contamination determining system 132 proceeds to step 303 (FIG. 3).

The above described embodiment for estimating an amount of contaminant ions in target 12, i.e., step S302-3, requires actual measuring of a mass resolution value of mass analyzer 50, which might be relatively complicated.

To avoid this problem, according to an alternative embodiment, the actual estimation of the contaminant ions (here, 57Fe+ and 58Ni+) in target 12 may be skipped. Rather, estimator 152 determines whether it is practically possible for mass analyzer 50 to filter out sufficient contaminant ions to meet the threshold of 5 ppm. Specifically, given the estimated amount of contaminant ions 57Fe+ and 58Ni+ in unfiltered ion beam $4_U$, step S302-2, estimator 152 determines whether a practically available mass resolution can effectively filter out sufficient 57Fe+ and 58Ni+ to meet the 5 ppm threshold. As discussed above, although a mass resolution of 200 is sufficient to filter out all 57Fe+ and 58Ni+ from ion beam 4 of 115In++, such a high mass resolution is not practically available.

According to the alternative embodiment, a threshold is set to the measured amount of the experiment isotope, e.g., 56Fe+, in step S302-1. In step S302-3, the amount of 56Fe+ in unfiltered ion beam $4_U$ is compared to the threshold in step S302-3. If the measured amount of 56Fe+ is larger than the threshold, no practically available mass resolution can filter out sufficient 57Fe+ and 58Ni+ to meet the 5 ppm threshold. In this case, a warning is communicated to a user of ion implantation system 10 to suspend implantation and maintain/repair ion beam generating sub-system 2 to avoid scrap. If the measured amount of 56Fe+ equals zero, no contaminant ions will be in target 12. In this case, a satisfactory report will be communicated to a user of ion implantation system 10 to continue ion implantation. If the measured amount of 56Fe+ is smaller than the threshold, but larger than zero, it is practically possible to filter out sufficient 57Fe+ and 58Ni+ to meet the 5 ppm threshold, but further determination of mass resolution needs to be made. As a consequence, the operation of ion beam contamination determining system 132 proceeds to step 303 (FIG. 3). Here, for example, if 56Fe+ is used to estimate 57Fe+ and 58Ni+ and if the safety factor of 2X is applied, 5 ppm threshold corresponds to a threshold of 0.12 on the ratio between 56Fe+ and 115In++ in ion beam $4_U$, assuming that mass resolution value of 200 is not practical. In other words, if the ratio between 56Fe+ and 115In++ in unfiltered ion beam $4_U$ is 0.012, a mass resolution of 200 is required to meet the 5 ppm threshold, which is not practically available. That is, for example, if the measured ratio between 56Fe+ and 115In++ is larger than 0.012, no practically available mass resolution can filter out sufficient 57Fe+ and 58Ni+ to meet the 5 ppm threshold.

In the above described embodiments, the amount of 58Ni+ is estimated from the measured amount of 56Fe+ based on the empirical data of one-to-one ratio between 57Fe+ and 58Ni+. It should be noted that other approaches to estimate 58Ni+ amount are also included in the present invention. For example, an amount of 58Ni+ may be estimated by measuring an experiment isotope of 60Ni+ in unfiltered ion beam $4_U$.

Referring back to FIG. 3, next in step 303, if contaminants ions are detected in step S302 and the amount is larger than zero but less than the threshold, filtering characteristic determinator 154 of calculator 150 will determine a capacity of ion implantation system 10 to filter out a portion of the contaminant ions (here, 57Fe+ and 58Ni+) to make the amount of the contaminant ions in target 12 meet the preset threshold, e.g., 5 ppm. Specifically, filtering characteristic determinator 154 determines whether a mass resolution value of mass analyzer 50 meets a minimum value (filtering threshold) required to meet the 5 ppm threshold. In step 303-1, filtering characteristic determinator 154 determines the minimum value of mass resolution (filtering threshold). The minimum mass resolution may be determined based on one of the following: a specification requirement of ion implantation system 10 for the expected 115In++ ion of ion beam 4; a mass resolving slit 54 setting of ion implantation system 10; and the measured amount of the experiment isotope 56Fe+ in unfiltered ion beam $4_U$.

For example, for ion beam 4 of 115In++, the minimum mass resolution required by the specification of ion implantation system 10 (e.g., a VIISta 810) to filter out contaminants 57Fe+ and 58Ni+ is 85. Alternatively, if MRS 54 is already set to be, for example, 2.5 mm, the minimum mass resolution may be determined based on the expected minimum mass resolution that corresponds to this MRS setting (see Table 1.), i.e., 105. The above two methods of determining minimum mass resolution, however, do not take advantage of the actually estimated amounts of contaminant ions, i.e., 57Fe+ and 58Ni+, in unfiltered ion beam $4_U$ (FIG. 1).

According to one embodiment, the measured amount of the experiment isotope, here 56Fe+, in unfiltered ion beam $4_U$ (FIG. 1) may be used to determine a minimum mass resolution. The relationship between a measured amount of the experiment isotope 56Fe+ and a minimum mass resolution required for filtering out contaminant ions, here 57Fe+ and 58Ni+, may be obtained by a simulation of empirical data. The details of obtaining such empirical data and the simulation are not necessary for an understanding of the current invention and thus will not be provided. For example, the relationship between a minimum mass resolution required to filter out 57Fe+ and 58Ni+ to meet the 5 ppm threshold and the measured 56Fe+ in ion beam $4_U$ may be shown by the following formula:

Minimum Mass Resolution=28.71* ln(56Fe+/
  115In++ beam current ratio)+253.61    (3)

This formula is obtained based on the assumed one-to-one ratio between 57Fe+ and 58Ni+ and in consideration of the safety factor of 2X. It should be noted that although formula (3) is used in this embodiment to determine a minimum mass resolution, other convenient manners, such as a look up table, may also be used to determine a minimum mass resolution based on the measured amount of the experiment isotopes 56Fe+ and are included in the present invention.

Next, in step S303-2, filtering characteristic determinator 154 coordinates with measurement implementer 144 to measure whether the mass resolution of mass analyzer 50 meets the minimum mass resolution (filtering threshold) determined in step S303-1. Please note, here, the system parameters have already been determined/obtained by system parameter determinator 142. The details of step S303-2 are shown in the flow diagram of FIG. 5.

Figure 5:
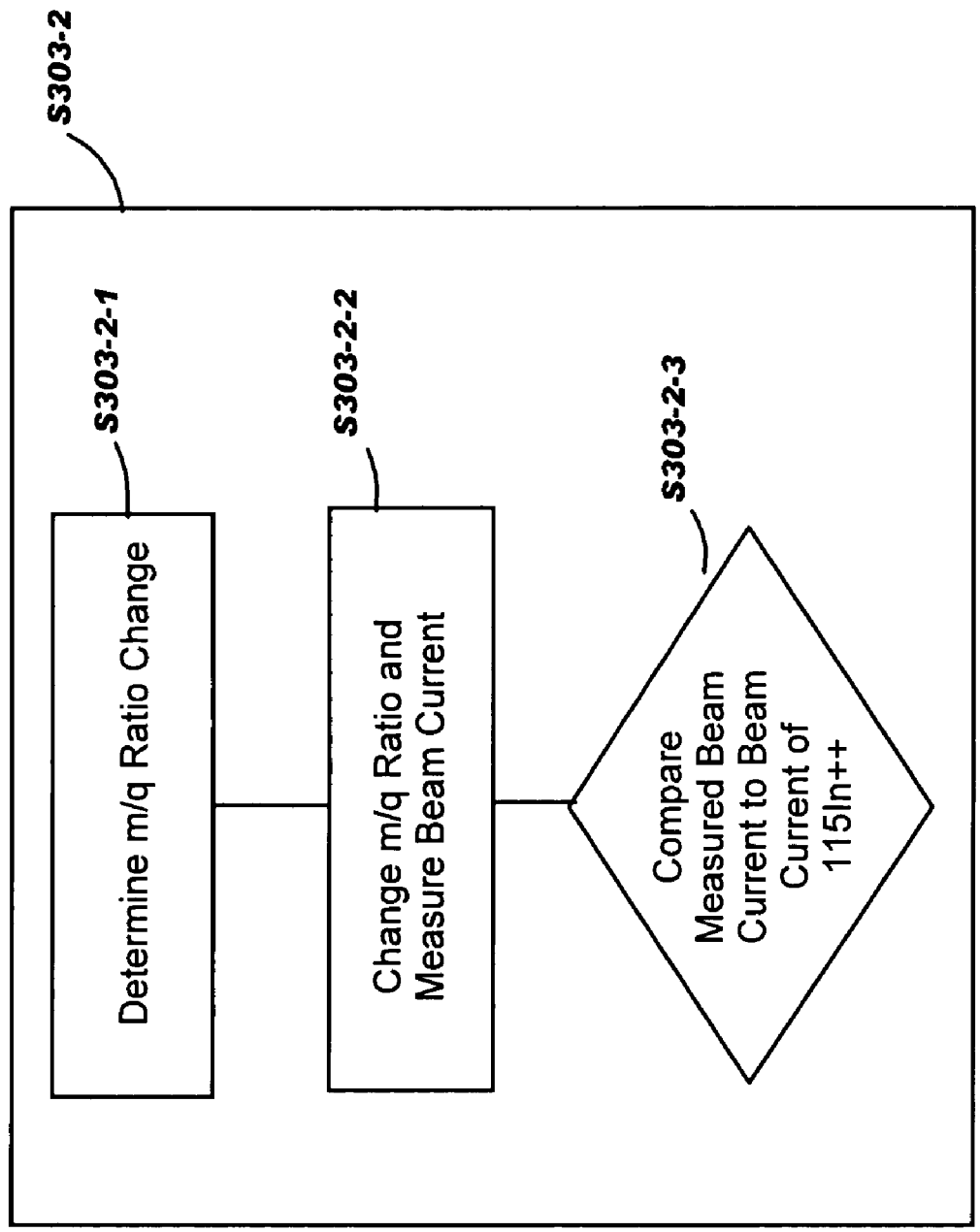
FIG. 5 shows details of step S303-2 of the flow diagram of FIG. 3 according to one embodiment of the invention.

Referring to FIG. 5, first in step S303-2-1, measurement implementer 144 determines a mass/charge ratio change based on the minimum mass resolution determined in step S303-1. The following formula may be used:

m/q ratio change=(m/q Ratio of the expected ion)/
  (2*Minimum Mass Resolution)    (4)

For example, here for an ion beam of 115In++, m/q ratio change=57.5/(2*Required Mass Resolution).

Figure 6:
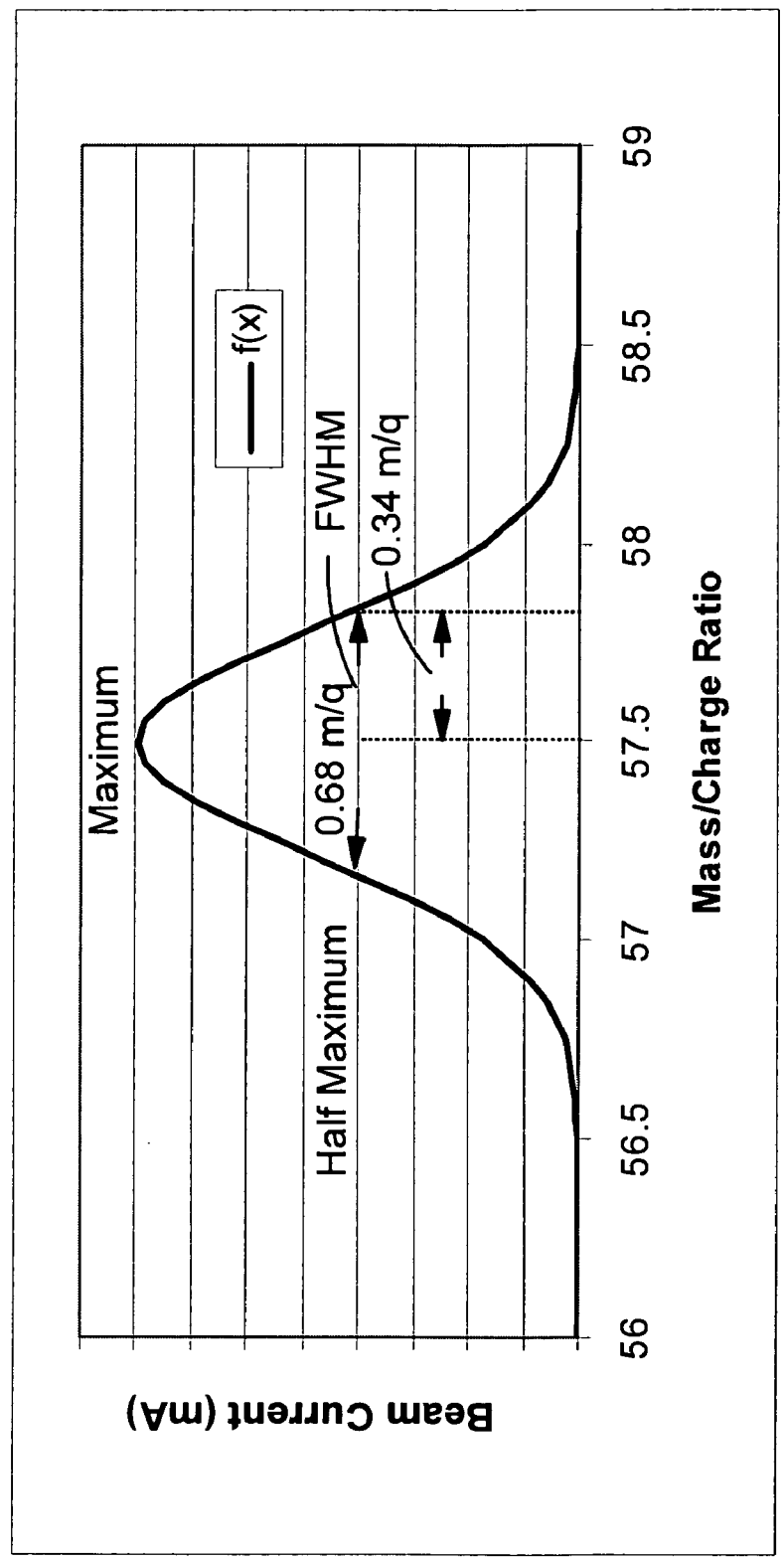
FIG. 6 shows an illustrative profile of an 115In++ ion beam generated by an ion implantation system with a mass resolution of 85, according to prior art.

Details relating to formula (4) and the following steps of step S303-2 will now be described. As shown in FIG. 6, a profile of an ion beam is assumed to be a perfect Gaussian profile of a peak centered at 57.5. For a Gaussian profile, the mass resolution is defined as mass/delta mass, wherein delta mass is the full width of the peak at half maximum (FWHM) in the m/q ratio axis. For example, FIG. 6 shows a Gaussian profile of 115In++ (potentially including 57Fe+ and 58Ni+ because those mass/charge ratios are included in the large peak). In the profile of FIG. 6, the FWHM is 0.68 m/q units, which gives a mass resolution of 57.5/0.68=85. According to the profile of FIG. 6, if m/q ratio is moved 0.34 (half of the FWHM, i.e., 0.68) units from the 57.5 of 115In++, either increasingly or decreasingly, beam current will decrease to half of the maximum. The change in mass/charge ratio to obtain half maximum of beam current, here 0.34, is defined as m/q unit change for the mass resolution.

To determine whether a mass resolution of ion implantation system 10 meets a minimum mass resolution (filtering threshold), for example 85, a measured ion beam profile may be compared to a perfect Gaussian profile of mass resolution 85, like the one in FIG. 6. Specifically, when the m/q ratio is moved by 0.34 units from 57.5 that corresponds to the maximum of the peak, either increasingly or decreasingly, if the measured beam current equals to half of the maximum, the measured mass resolution is considered equal to 85. If the measured beam current is smaller than half of the maximum, the measured mass resolution is considered larger than 85. On the other hand, if the measured beam current is larger than half of the maximum, the measured mass resolution is considered smaller than 85. The flowing steps of step S303-2 are designed accordingly.

Referring back to FIG. 5, next in step S303-2-2, referring also to FIGS. 1 and 2, measurement implementer 144 controls analyzing magnet 52 current to change the magnetic field of analyzing magnet 52 corresponding to the mass/charge ratio change determined in step S303-2-1. In addition, an ion beam current is measured by measurer 200.

Next in step S303-2-3, the measured ion beam current is compared to the ion beam current of 115In++ beam (which is measured in step S302-1-1 and saved, for example, in database 128) by filtering characteristic determinator 154. If the measured ion beam current is smaller than half of the 115In++ beam current, the mass resolution of mass analyzer 50 is considered larger than the minimum mass resolution (filtering threshold) determined in step S303-1, and ion beam contamination determining system 132 issues a satisfactory report to a user of ion implantation system 10. If the measured ion beam current is larger than half of the 115In++ beam current, the mass resolution of mass analyzer 50 is considered smaller than the minimum mass resolution determined in step S303-1, and ion beam contamination determining system 132 issues a warning report to be communicated to a user of ion implantation system 10 to suspend ion implantation and probably reset/repair system 10 including mass analyzer 50.

According to another embodiment, step S303-2 may include an additional step (not shown) before step S303-2-1. In this step, measurement implementer 144 (FIG. 2) controls ion implantation system 10 to move mass resolving slit (MRS) 54 to a setting required to achieve the minimum mass resolution determined in step S303-1. It should be understood that the MRS setting only corresponds to an expected minimum resolution as described before with respect to Table 1. The actual mass resolution may diverge from the expected minimum mass resolution. As such, steps S303-2-1 to S303-2-3 still need to be performed subsequent to this alternative step to determine whether the actual mass resolution meets the filtering threshold (minimum mass resolution) determined in step S303-1.

In the previous description, an ion beam of 115In++, with 57Fe+ and 58Ni+ as the potential contaminant ions is used as an illustrative example. However, it should be understood that the present invention is not limited to this example. The present invention may be used to determine contamination of other ion beams also. For example, the present invention may be used to determine contaminants 74Ge+ and 76Ge+ in an ion beam of 75As+ using 70Ge and 72Ge as experiment isotopes, 98Mo++ in 49BF2+ using 98Mo+ as experiment isotope, 11B+ in 310 P+++ using 31P++ as experiment isotope, 28CO+ in 28Si+ using 12C+ and 16O+ as experiment isotopes, and 28N2+ in 28Si+ using 14N+ and 14N++ as experiment isotopes, to list just a few.

4. Conclusion

In the previous discussion, it will be understood that the method steps discussed are performed by a processor, such as PU 122 of computer system 100, executing instructions of program product 130 (FIG. 2) stored in a memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While shown and described herein as a method, system and computer product for determining a contamination of an ion beam, it is understood that the invention further provides various alternative embodiments. For example, in another embodiment, the invention provides a business method that performs the process steps of the invention on a subscription, advertising, and/or fee basis. That is, a service provider, such as an Internet Service Provider, could offer to determine a contamination of an ion beam as described above. In this case, the service provider can create, maintain, and support, etc., a computer infrastructure, such as a computer system 100 (FIG. 2), which performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for determining a contamination of an ion beam. In this case, a computer infrastructure, such as computer system 100 (FIG. 2), can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device, such as computer system 100 (FIG. 2), from a computer-readable medium; (2) adding one or more computing devices to the computer infrastructure; and (3) incorporating and/or modifying one or more existing systems of the computer infrastructure, to enable the computer infrastructure to perform the process steps of the invention. According to this embodiment, measuring of contaminant ions in an ion beam generated by ion implantation system 10 can be performed remotely from the computer infrastructure including computer system 100 (FIG. 2). Specifically, measurement data is received by computer system 100, calculated therein, and determination results are transferred back to a remote user, e.g., at the site of the measurement.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for determining a contamination of an ion beam generated in an ion implantation system, the method comprising steps of:
    estimating a first amount of a contaminant first ion in the ion beam before the ion beam is filtered by measuring an amount of a second different ion in the ion beam before the ion beam is filtered; and determining the contamination of the ion beam based on the estimated first amount of the contaminant first ion.

2. The method of claim 1, further comprising a step of determining whether a capacity of the ion implantation system to implant a second amount of the contaminant first ion in a target meets a pre-set threshold by determining a filtering characteristic of the ion implantation system.

3. The method of claim 2, wherein the filtering characteristic determining step includes determining a mass resolution value of the ion implantation system.

4. The method of claim 3, further comprising a step of determining whether the mass resolution value is at least equal to a minimum value determined based on one of the following:
   a specification requirement of the ion implantation system for an expected ion of the ion beam;
   a mass resolving slit setting of the ion implantation system; and
   the amount of the second different ion measured in the ion beam.

5. The method of claim 1, wherein the second different ion is separable from an ion beam of an expected ion.

6. The method of claim 1, wherein the contaminant first ion and the second different ion are isotopes of a same element.

7. The method of claim 1, further including a step for estimating a second amount of the contaminant first ion in a target based on the amount of the second different ion measured in the ion beam.

8. A program product stored on a computer-readable medium, which when executed, enables a computer infrastructure to determine a contamination of an ion beam generated in an ion implantation system, the program product comprising computer program code for enabling the computer infrastructure to:
   estimate a first amount of a contaminant first ion in the ion beam before the ion beam is filtered by measuring an amount of a second different ion in the ion beam before the ion beam is filtered;
   determine the contamination of the ion beam based on the estimated first amount of the contaminant first ion; and
   communicate a result of the determination to a user of the ion implantation system.

9. The computer product of claim 8, further comprising computer program code for enabling the computer infrastructure to determine whether a capacity of the ion implantation system to implant a second amount of the contaminant first ion in a target meets a pre-set threshold by determining a filtering characteristic of the ion implantation system.

10. The program product of claim 9, wherein the filtering characteristic determining includes determining a mass resolution value of the ion implantation system.

11. The program product of claim 10, further comprising computer program code for enabling the computer infrastructure to determine whether the mass resolution value is at least equal to a minimum value configured based on one of the following:
   a specification requirement of the ion implantation system for an expected ion of the ion beam;
   a mass resolving slit setting of the ion implantation system; and
   the amount of the second different ion measured in the ion beam.

12. The program product of claim 8, wherein the second different ion is separable from an ion beam of an expected ion.

13. The program product of claim 8, further comprising computer program code for enabling the computer infrastructure to estimate a second amount of the contaminant first ion in a target based on the amount of the second different ion measured in the ion beam.

14. The program product of claim 8, wherein the contaminant first ion and the second different ion are isotopes of a same element.

15. An ion implantation system, the ion implantation system comprising:
   an ion beam generating system for generating an ion beam; and
   a contamination determining system including:
      a measurer for measuring an amount of an experiment ion in the ion beam before the ion beam is filtered; and
      an estimator for estimating a first amount of a contaminant ion different than the experiment ion based on the measurement of the experiment ion in the ion beam before the ion beam is filtered to determine the contamination of the ion beam.

16. The system of claim 15, further comprising a determinator for determining whether a capacity of the ion implantation system to implant a second amount of the contaminant ion in a target meets a pre-set threshold by determining a filtering characteristic of the ion implantation system.

17. The system of claim 16, wherein the filtering characteristic determining includes determining a mass resolution value of the ion implantation system.

18. The system of claim 17, wherein the determinator is further configured to determine whether the mass resolution value is at least equal to a minimum value configured based on one of the following:
   a specification requirement of the ion implantation system for an expected ion of the ion beam;
   a mass resolving slit setting of the ion implantation system; and
   the amount of the experiment ion measured in the ion beam.

19. The system of claim 15, wherein the experiment ion is separable from an ion beam of an expected ion.

20. The system of claim 15, wherein the estimator is further configured to estimate a second amount of the contaminant ion in a target based on the amount of the experiment ion measured in the ion beam.

21. The system of claim 15, wherein the contaminant ion and the experiment ion are isotopes of a same element.

22. A system for determining a contamination of an ion beam generated in an ion implantation system, the system comprising:
   a measurer for measuring an amount of an experiment ion in the ion beam before the ion beam is filtered; and
   an estimator for estimating a first amount of a contaminant ion different than the experiment ion based on the measurement of the experiment ion in the ion beam before the ion beam is filtered to determine the contamination of the ion beam.

23. The system of claim 22, further comprising a determinator for determining whether a capacity of the ion implantation system to implant a second amount of the contaminant ion in a target meets a pre-set threshold by determining a filtering characteristic of the ion implantation system.

24. The system of claim 23, wherein the filtering characteristic determining includes determining a mass resolution value of the ion implantation system.

25. The system of claim 24, wherein the determinator is further configured to determine whether the mass resolution value is at least equal to a minimum value configured based on one of the following:

a specification requirement of the ion implantation system for an expected ion of the ion beam;

a mass resolving slit setting of the ion implantation system; and the amount of the experiment ion measured in the ion beam.

26. The system of claim 22, wherein the experiment ion is separable from an ion beam of an expected ion.

27. The system of claim 22, wherein the estimator is further configured to estimate a second amount of the contaminant ion in a target based on the amount of the experiment ion measured in the ion beam.

28. The system of claim 22, wherein the contaminant ion and the experiment ion are isotopes of a same element.

29. A method of generating a system for determining a contamination of an ion beam generated in an ion implantation system, the method comprising: providing a computer infrastructure operable to:

estimate a first amount of a contaminant first ion in the ion beam before the ion beam is filtered by measuring an amount of a second different ion in the ion beam before the ion beam is filtered;

determine the contamination of the ion beam based on the estimated first amount of the contaminant first ion; and communicate a result of the determination to a user of the ion implantation system.

30. The method of claim 29, wherein the computer infrastructure is further operable to determine whether a capacity of the ion implantation system to implant a second amount of the contaminant first ion in a target meets a pre-set threshold by determining a filtering characteristic of the ion implantation system.

31. The method of claim 30, wherein the filtering characteristic determining includes determining a mass resolution value of the ion implantation system.

32. The method of claim 31, wherein the computer infrastructure is further operable to determine whether the mass resolution value is at least equal to a minimum value configured based on one of the following:

a specification requirement of the ion implantation system for an expected ion of the ion beam;

a mass resolving slit setting of the ion implantation system; and the amount of the second different ion measured in the ion beam.

33. The method of claim 29, wherein the second different ion is separable from an ion beam of an expected ion.

34. The method of claim 29, wherein the computer infrastructure is further operable to estimate a second amount of the contaminant first ion in a target based on the amount of the second different ion measured in the ion beam.

35. The method of claim 29, wherein the contaminant first ion and the second different ion are isotopes of a same element.

* * * * *